United States Patent
Haacke et al.

(10) Patent No.: US 9,977,110 B2
(45) Date of Patent: May 22, 2018

(54) METHOD AND APPARATUS FOR MAGNETIC RESONANCE IMAGING WITH RADIO FREQUENCY PULSES GENERATED ACCORDING TO PHASE CRITERIA

(71) Applicants: E. Mark Haacke, Detroit, MI (US); Wei Feng, Ann Arbor, MI (US)

(72) Inventors: E. Mark Haacke, Detroit, MI (US); Wei Feng, Ann Arbor, MI (US)

(73) Assignee: Magnetic Resonance Innovations, Inc., Bingham Farms, MI (US)

( * ) Notice: Subject to any disclaimer, the term of this patent is extended or adjusted under 35 U.S.C. 154(b) by 483 days.

(21) Appl. No.: 14/707,279

(22) Filed: May 8, 2015

(65) Prior Publication Data

US 2015/0323635 A1    Nov. 12, 2015

Related U.S. Application Data

(60) Provisional application No. 61/990,499, filed on May 8, 2014.

(51) Int. Cl.
| | | |
|---|---|---|
| *G01V 3/00* | (2006.01) | |
| *G01R 33/565* | (2006.01) | |
| *G01R 33/561* | (2006.01) | |
| *G01R 33/34* | (2006.01) | |
| *G01R 33/48* | (2006.01) | |

(52) U.S. Cl.
CPC .......... *G01R 33/565* (2013.01); *G01R 33/34* (2013.01); *G01R 33/5616* (2013.01); *G01R 33/5659* (2013.01); *G01R 33/4822* (2013.01)

(58) Field of Classification Search
CPC .. G01R 33/565; G01R 33/34; G01R 33/5616; G01R 33/5659; G01R 33/4822
See application file for complete search history.

(56) References Cited

U.S. PATENT DOCUMENTS

2014/0055140 A1*  2/2014  Umeda ............ G01R 33/3678
                                                            324/322

* cited by examiner

*Primary Examiner* — Daniel Miller
(74) *Attorney, Agent, or Firm* — Foley & Lardner LLP

(57) ABSTRACT

In this disclosure, a process of imaging a target object using magnetic resonance (MR) includes an MRI scanner scanning the target object using a first transmit RF pulse. A processor associated with the MRI scanner can acquire magnitude and/or phase data associated with a first RF signal produced (or echoed) by the target object responsive to the MRI scan. The processor can determine a second transmit RF pulse for use to scan the target object based on the acquired data and according to a given phase criterion. The phase criterion can be configured to enforce mitigation of a phase distribution estimated based on the acquired data.

16 Claims, 5 Drawing Sheets

METHOD AND APPARATUS FOR MAGNETIC RESONANCE IMAGING WITH RADIO FREQUENCY PULSES GENERATED ACCORDING TO PHASE CRITERIA

RELATED APPLICATION

The present application claims priority to U.S. Provisional Application No. 61/990,499, entitled "METHOD AND APPARATUS FOR MAGNETIC RESONANCE IMAGING WITH RADIO FREQUENCY PULSES GENERATED ACCORDING TO PHASE CRITERIA" and filed on May 8, 2014, which is incorporated herein by reference in its entirety for all purposes.

BACKGROUND OF THE DISCLOSURE

The present disclosure relates generally to the field of magnetic resonance imaging (MRI). In particular, this disclosure relates to, but is not limited to gradient echo imaging applications in the field of nuclear magnetic resonance imaging (more commonly referred to today as MRI) for both animal and human studies.

SUMMARY OF THE DISCLOSURE

According to at least one aspect, a method for magnetic resonance imaging (MRI) which includes performing a first MRI scan on a target object using one or more first transmit radio frequency (RF) pulses (e.g., a first train/sequence of transmit RF pulses) and acquiring data associated with one or more first RF signals (e.g., a first train/sequence of RF signals) produced by the target object responsive to the first MRI scan. This disclosure may sometimes refer to one or more pulses/signals as a train or sequence of pulses/signals. The method can include determining a second train of transmit RF pulses designed based on the acquired data and a phase criterion (or phase constraint). The method can also include performing a second MRI scan on the target object using the second train of transmit RF pulses. In some implementations, the phase criterion (or phase constraint) includes the determined second train of transmit RF pulses nulling (e.g., cancelling, reducing, minimizing, nullifying or mitigating) a phase associated with the acquired data when performing the second MRI scan.

According to at least one aspect, an apparatus for magnetic resonance imaging (MRI) includes a processor and a memory storing computer code instructions. The processor can be configured, upon executing the computer code instructions, to cause the apparatus to perform a first MRI scan on a target object using a first train of transmit radio frequency (RF) pulses and acquire data associated with a first train of radio frequency (RF) signals produced by the target object responsive to the first MRI scan. The processor can be configured to determine a second train of transmit RF pulses designed based on the acquired data and a phase criterion (or phase constraint). The processor can also be configured to cause the apparatus to perform a second MRI scan to the target object using the second train of transmit RF pulses. In some implementations, the phase criterion (or phase constraint) includes the determined second train of transmit RF pulses nulling (e.g., cancelling, reducing or mitigating) a phase associated with the acquired data when performing the second MRI scan.

According to at least one aspect, a computer-readable medium includes computer code instructions stored thereon. The computer code instructions when executed by a processor cause a method for magnetic resonance imaging (MRI) to be performed. The method for magnetic resonance imaging (MRI) can include performing a first MRI scan on a target object using a first train of transmit radio frequency (RF) pulses and acquiring data associated with a first train of radio frequency (RF) signals produced by the target object responsive to the first MRI scan. The method can include determining a second train of transmit RF pulses designed based on the acquired data and a phase criterion (or phase constraint). The method can also include performing a second MRI scan to the target object using the second train of transmit RF pulses. In some implementations, the phase criterion (or phase constraint) includes the determined second train of transmit RF pulses nulling (e.g., cancelling, reducing or mitigating) a phase associated with the acquired data when performing the second MRI scan.

According to at least one aspect, a method of magnetic resonance imaging (MRI) can include acquiring magnitude and phase data associated with an object scanned according to three-dimensional gradient echo imaging. The method can include estimating a phase distribution based on the acquired data and determining a transmit radio frequency (RF) pulse (or a sequence/train of transmit RF pulses) configured to null (e.g., cancel, nullify, minimize, reduce or mitigate) the estimated phase distribution when used to image the object.

According to at least one aspect, an apparatus includes a processor and a memory storing computer code instructions thereon. The processor can be configured, upon executing the computer code instructions, to cause the apparatus to perform a method of magnetic resonance imaging (MRI). The method can include acquiring magnitude and phase data associated with an object scanned according to three-dimensional gradient echo imaging. The method can include estimating a phase distribution based on the acquired data and determining a transmit radio frequency (RF) pulse (or a sequence of transmit RF pulses) configured to null (e.g., cancel, minimize, nullify, reduce or mitigate) the estimated phase pattern when used to image the object.

According to at least one aspect, a computer-readable medium includes computer code instructions stored thereon. The computer code instructions when executed by a processor cause a method for magnetic resonance imaging (MRI) to be performed. The method can include acquiring magnitude and phase data associated with an object scanned according to three-dimensional gradient echo imaging. The method can include estimating a phase distribution based on the acquired data and determining a transmit radio frequency (RF) pulse (or a sequence of transmit RF pulses) configured to null (e.g., cancel, nullify, reduce, minimize, counteract or mitigate) the estimated phase pattern when used to image the object.

According to at least one aspect, a method of magnetic resonance imaging (MRI) can include acquiring magnitude and phase data associated with an object scanned according to three-dimensional gradient echo imaging and determining a transmit radio frequency (RF) pulse (or a sequence of transmit RF pulses) based on the acquired data. The transmit RF pulse (or sequence of transmit RF pulses) can be determined to mitigate a phase associated with the acquired data when used to image the object.

According to at least one aspect, an apparatus includes a processor and a memory storing computer code instructions thereon. The processor can be configured, upon executing the computer code instructions, to cause the apparatus to perform a method of magnetic resonance imaging (MRI). The method can include acquiring magnitude and phase data associated with an object scanned according to three-dimensional gradient echo imaging and determining a transmit radio frequency (RF) pulse (or a sequence of transmit RF pulses) based on the acquired data. The transmit RF pulse (or a sequence of transmit RF pulses) can be determined to mitigate a phase associated with the acquired data when used to image the object.

According to at least one aspect, a computer-readable medium includes computer code instructions stored thereon. The computer code instructions when executed by a processor cause a method for magnetic resonance imaging (MRI) to be performed. The method can include acquiring magnitude and phase data associated with an object scanned according to three-dimensional gradient echo imaging and determining a transmit radio frequency (RF) (or a sequence of transmit RF pulses) pulse based on the acquired data. The transmit RF pulse (or a sequence of transmit RF pulses) can be determined to mitigate a phase associated with the acquired data when used to image the object.

According to at least one aspect, a method of magnetic resonance imaging (MRI) can include acquiring magnitude and phase data associated with an object scanned according to three-dimensional gradient echo imaging and determining a transmit radio frequency (RF) pulse (or a sequence of transmit RF pulses) based on the acquired data. The transmit RF pulse (or a sequence of transmit RF pulses) can be determined to produce a specific (or given) pulse pattern when used to image the object.

According to at least one aspect, an apparatus includes a processor and a memory storing computer code instructions thereon. The processor can be configured, upon executing the computer code instructions, to cause the apparatus to perform a method of magnetic resonance imaging (MRI). The method can include acquiring magnitude and phase data associated with an object scanned according to three-dimensional gradient echo imaging and determining a transmit radio frequency (RF) pulse (or a sequence of transmit RF pulses) based on the acquired data. The transmit RF pulse (or a sequence of transmit RF pulses) can be determined to produce a specific (or given) pulse distribution when used to image the object.

According to at least one aspect, a computer-readable medium includes computer code instructions stored thereon. The computer code instructions when executed by a processor cause a method for magnetic resonance imaging (MRI) to be performed. The method can include acquiring magnitude and phase data associated with an object scanned according to three-dimensional gradient echo imaging and determining a transmit radio frequency (RF) pulse (or a sequence of transmit RF pulses) based on the acquired data. The transmit RF pulse (or a sequence of transmit RF pulses) can be determined to provide a specific (or given) pulse distribution when used to image the object.

DETAILED DESCRIPTION

Figure 1:
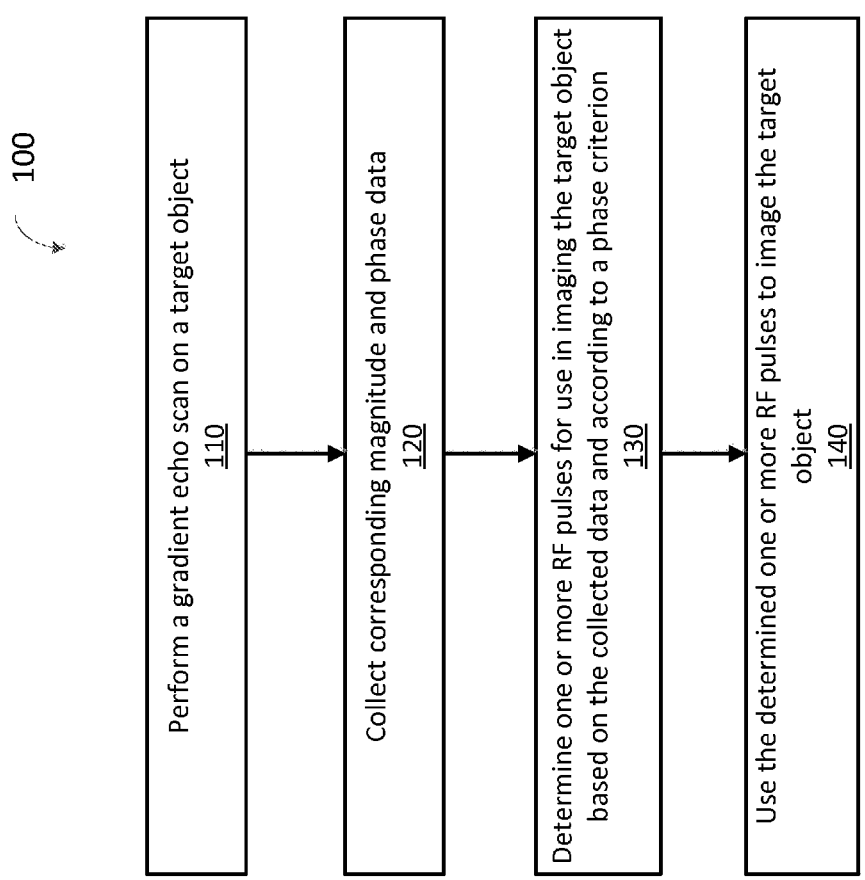
FIG. 1 shows a flowchart illustrating an example process of imaging a target object using magnetic resonance (MR)

Magnetic resonance imaging (MRI) is an imaging modality that uses magnetic fields to reconstruct a structure of scanned objects of interest. An MRI scanner includes a magnet for generating a strong static magnetic field, such as a magnetic field in the range of 1.5 Tesla (T) to 7 T, and radio frequency (RF) transceivers for transmitting and/or receiving RF signals. When a body is placed in the generated static magnetic field, the Hydrogen protons within the body align to the magnetic field. An RF pulse is applied in the presence of an oscillating B1 field to tip the spins so that there is a bulk magnetization remaining in the transverse field. When the RF pulse is turned off, the Hydrogen protons return to alignment with the static magnetic field, the longitudinal component increasing and the transverse component decreasing. At a chosen time point, referred to as the sampling time, or echo time, or gradient echo time, data is collected and the received signal is used to reconstruct an image of the scanned body or a part thereof.

Different pulse sequences can be employed in MRI providing different magnetic field spatial varying patterns to the static magnetic field, therefore allowing imaging of different characteristics of the body tissues. Examples of pulse sequences include: spin echo sequences, inversion recovery sequences, three-dimensional (3-D) gradient echo sequences, two-dimensional (2-D) echo gradient sequences, diffusion weighted sequences, saturation recovery sequences, echo-planar pulse sequences, spiral pulse sequences, steady state free precession (SSFP) sequences, and other pulse sequences known in the art. Different pulse sequences have different parameters, such as timing, phase, or the like, to be designed or adjusted in a way to provide the desired contrast and to avoid signal-distorting artifacts and improve reconstructed image quality.

For instance, when using gradient echo sequences, bulk tissue susceptibility can result in local magnetic field inhomogeneity. The local magnetic field inhomogeneity can induce phase variation in the received signals therefore resulting in reconstructed image distortion. Tissue susceptibility can be an important property that has great potential in many clinical applications, such as neurovascular imaging and quantitative susceptibility mapping. However, local field variations induced by bulk susceptibility can interfere with and obscure tissue signal in certain areas of the brain. An example would be signal loss due to dephasing in the orbitofrontal area of the brain in susceptibility weighted imaging (SWI).

In existing MR imaging processes, RF pulses may be designed in a way to create uniform images in the magnitude domain from non-uniform responses of RF receivers used in collecting the MRI data on phantoms, animals and/or humans. In this disclosure, a processor associated with a MRI imaging system can design or create RF pulses in ways to create a phase distribution that is specifically defined to match or counter the phase that would normally be seen in gradient echo imaging. The usual field variations from magnets and air/tissue interfaces can be viewed as contaminations that affect the quality of the reconstructed images. The ability to manipulate the phase can be used in designing RF pulses to counter these deleterious effects and/or to pre-process the data to both improve image quality and to improve image processing.

In this disclosure, a process of imaging a target object using magnetic resonance (MR) can include designing RF pulses based on one or more phase criteria. A MRI imaging system (e.g., MRI scanner), or a processor thereof, can design or create RF pulses by scanning a target object, recording corresponding magnitude and phase data, and adjusting a phase associated with an RF pulse, e.g., based on recorded phase data, in a way to satisfy a given criterion. In other words, the RF pulses can be designed in a way to manipulate the phase information in a corresponding output MR image generated using the designed pulses. In some implementations, RF pulses designed according to processes described in this disclosure can change the outcome of both magnitude and phase data in MR images generated using the designed RF pulses. The MRI imaging system can use designed RF pulses to generate a specific magnetization in order to image the target object. The MRI imaging system can employ the phase criterion to mitigate artifacts distorting the received signal, improve image quality, modify the final phase of the images or a combination thereof. In some implementations, the MRI imaging system can employ a multi-dimensional RF pulse design process using a modified spokes approach. In some implementations, the modified spokes approach is geared toward compensating for bulk tissue susceptibility induced phase variations.

FIG. 1 shows a flowchart illustrating a process 100 of imaging a target object using MR. An MRI scanner can perform a gradient echo scan on a target object or subject (stage 110). The MRI scanner can transmit a first transmit RF pulse, such as a gradient echo pulse, to scan the target object. For instance, the MRI scanner can use a sinc pulse in scanning the target object. The MRI scanner can use other gradient echo pulses to scan the target object, such as a 2-D gradient echo sequence, 3-D gradient echo sequence or SSFP sequence. The MRI scanner or a processor associated therewith can collect magnitude and phase data associated with a first RF signal received in response to transmission of the first transmit RF pulse (stage 120). Subsequent to transmission of a first transmit gradient echo pulse, one or more RF receivers associated with the MRI scanner can receive a RF signal produced (or echoed) by the target object in response to transmission of the first transmit gradient echo pulse. The received first RF signal can include an RF signal associated with three-dimensional (3-D) multi-echo gradient echo sequence, an RF signal associated with a two-dimensional (2-D) multi-echo gradient echo sequence or a steady state free precession (SSFP) sequence. The MRI scanner or a processor associated therewith can record magnitude and phase data associated with the received first RF signal. The processor can be a processor embedded within the MRI scanner or a processor in a computer device (or other electronic device) coupled to the MRI scanner. The processor can comprise circuitry, or any form of hardware executing software or program code. The processor can then determine a second transmit RF pulse for use in imaging the target object based on the recorded data (stage 130). The processor can determine the second transmit RF pulse in a way to satisfy a given phase criterion. For example, the processor can determine the second transmit RF pulse in a way to nullify or mitigate a phase that would otherwise exist in a second RF signal received at echo time (TE) or at repeat time (TR) by the RF receiver(s) in response to transmission of the second transmit RF pulse.

Cancelling or diminishing a phase (e.g., a calibration phase) that would otherwise exist in a signal received at TE can help reduce effects of non-uniformity in the static magnetic field within each voxel and/or interference or energy transfer between spinning Hydrogen nuclei. Local non-uniformity (at the voxel level) of the magnetic field can be due to imperfections in the magnet of the scanner and/or magnetic susceptibility associated with the scanned object. For example, in imaging processes such as susceptibility weighted imaging, cancelling or reducing such phases alleviates or removes distortions to pristine phase data. Cancelling or diminishing a phase that would otherwise exist in a signal received at TR can help create a SSFP magnitude image with given properties of uniformity, for example. In some implementations, the processor can determine the second transmit RF pulse based on a phase map created for use in cancelling or reducing phase information that would otherwise exist in signals received by the RF receiver(s). The processor can then provide the determined (or designed) second transmit RF pulse to the MRI scanner for use in imaging the target object. The scanner can then employ the determined transmit RF pulse to re-image the target object (stage 140). In particular, one or more RF transmitters of the MRI scanner can emit the determined second transmit RF pulse and the RF receiver(s) of the MRI scanner can receive corresponding echo RF signals. In some implementations, the RF receiver(s) of the MRI scanner can record echo RF signals received at an echo time TE (or repetition time TR) associated with the phase constraint. For instance, if the phase constraint includes mitigating a phase pattern at an echo time t=TE, the RF receiver(s) of the MRI scanner can be configured to record echo RF signals received at t=TE. The processor can use the received echo RF signals to reconstruct an image of the target object. The process described in FIG. 1 can be referred to as multi-dimensional susceptibility conditioned pulsed echoes (SCOPE) imaging process.

Gradient echo sequences can employ variable flip or tip angles. A tip angle can refer to an angle at which a net magnetization of the local magnetization or a portion of the target object (such as a voxel) is rotated or tipped relative to the static magnetic field. In a large tip angle (LTA) regime, the tip angle can be in the range of about 30° to about 180°. In a small tip angle (STA) regime, the tip angle can be around or less than 30°. When using RF pulses with 90° tip angle, such as the ones used in spin echo sequences, the initial longitudinal component of the magnetization can be reduced to zero immediately after transmission of the RF pulse. However, with gradient echo sequences, there can be some retention of the longitudinal component of the magnetization after transmission of the original RF pulse due to the use of a smaller tip angle, such as less than 90°. In some implementations, the desired goal is to create a transverse magnetization with specific properties related to phase and/or magnitude. In particular, in the STA regime, the relationship between the transverse magnetization denoted as M(x) and the RF pulse denoted as $b_x(t)$, can be described in some embodiments as, $$M(x)=i\gamma M_0 \int b_x(t) e^{ix \cdot k(t)} dt, \quad (1)$$

where x is a voxel location, $k(t)=-\gamma \int_t^T G(s)ds$ is the excitation k-space trajectory, γ is the gyromagnetic ratio, G(t) is the gradient trajectory over time and T is the time duration of the RF pulse. The Fourier transform relationship shown in equation (1) can be maintained with good accuracy as long as the flip angle is kept small enough, for example less than 30°.

Using the Fourier transform relationship shown in equation (1), the operation of determining the RF pulses (stage 130 in FIG. 1) can be formulated as a least squares optimization by discretizing the Fourier transform and adding a Tikhonov-type regularization term to the cost function, for example, $$b = \arg\min_b \{\|M-Ab\|_W^2 + \beta\|b\|^2\}, \quad (2)$$

where A is a Fourier transform matrix, b is the discretized RF pulse, W is a spatial weighting matrix, and $\beta$ is a regularization parameter. In some implementations, other optimization formulations can be used when designing the RF pulses. For instance, other types of regularization (other than Tykhonov-type regularization) can be employed.

In some implementations, the processor can determine or design the RF pulse in a way to compensate for phase variations induced by bulk tissue susceptibility. The MRI scanner can employ a conventional slab excitation pulse (such as a sinc pulse) to excite a slab with constant magnitude. In some implementations, when determining the RF pulse, the processor can constrain the excitation (or magnetization) pattern to have a constant magnitude and a prescribed phase inside the target object. From here on, the target object is referred to as $\Omega$, the outside of the target object is referred to as $\overline{\Omega}$, and the boundary of the target object is referred to as an. Both the magnitude and phase can be allowed to vary arbitrarily outside an. The excitation coverage and resolution of the RF pulse can be maximum along the slab direction, but the spokes in the RF k-space are very limited in the transverse directions. Allowing the excitation magnitude pattern to vary along the transverse directions outside the intersection may provide little benefit due to limited k-space coverage and resolution. Thus, the processor can enforce or maintain a constant magnitude pattern over the slab while imposing a given phase inside an. Specifically, the optimization formulation in equation (2) can be rewritten as $$b = \arg\min_{b,k,\varphi_{\overline{\Omega}}} \{\|Me^{-i\varphi_{\overline{\Omega}\cup\Omega}} - A(k)b\|^2 + \beta\|b\|^2\}, \quad (3)$$

where $\varphi$ represents the excitation phase function, and $\varphi_{\overline{\Omega}}$ and $\varphi_{\overline{\Omega}\cup\Omega}$ are the evaluations of excitation phase $\varphi$ at $\overline{\Omega}$ and $\overline{\Omega}\cup\Omega$, respectively. In some implementations, the compensation phase $\varphi_\Omega$ (i.e., the evaluation of 0 at $\Omega$) can be determined by scaling the bulk susceptibility map with the echo time (TE) in the intersection. In the optimization formulation described by equation (3), the Fourier encoding matrix A is a function of the spokes represented by k, for example.

Figure 2:
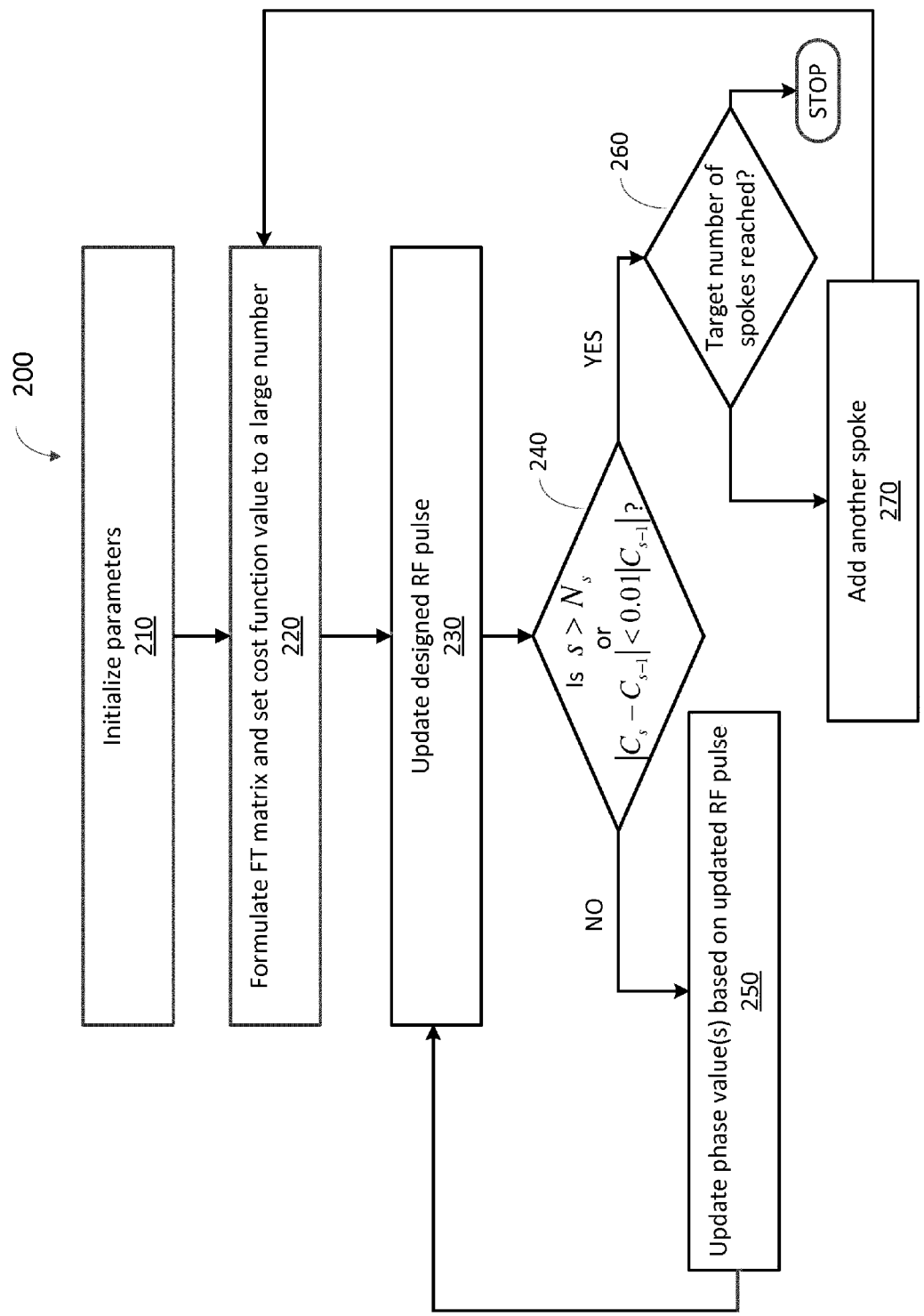
FIG. 2 shows a flowchart illustrating an example process of designing radio frequency (RF) pulses for use in imaging a target object with magnetic resonance (MR)

FIG. 2 shows a flowchart illustrating an example process 200 of determining RF pulses for use in imaging a target object with magnetic resonance (MR). Given a target number of spokes $N_t$, a phase compensation value $\varphi_\Omega = \varphi_\Omega^0$, and other relevant excitation parameters such as a parameter P which can include slab thickness, flip angle, excitation k-space resolution and maximum coverage, the processor can initialize a target excitation profile, initial spoke(s), and/or an initial number of spokes (stage 210). For example, the processor can set the excitation magnitude to a constant M and sets $\varphi_{\overline{\Omega}}$ to 0. In some examples, the center spoke ($k_x = 0$, $k_y = 0$) can be used in equation (3) to optimize the RF pulse at the beginning of the process 200. The processor can formulate the Fourier encoding matrix A based on some of the initial parameters set in stage 220 and set the cost function $C_0 = \|M-Ab\|_W^2 + \beta\|b\|^2$, at iteration 0, to a relatively large number to guarantee sufficient decrease in the cost function after updating RF pulse(s) at stage 230. Given the cost function in equation (3), the processor can update the pulse b (stage 230) as $$b = (A^T A + \beta I)^{-1} A^T M e^{-i\varphi_{\overline{\Omega}\cup\Omega}}. \quad (4)$$

The processor then can check whether a test criterion is met (decision block 240). The test criterion can be, for example, based on whether or not a detected stagnant reduction in the cost function $C_s = \|M-Ab\|_W^2 + \beta\|b\|^2$ (s is an iteration index) is detected and/or whether or not a given number of iterations has been reached. The processor can be configured to evaluate the cost function $C_s = \|M-Ab\|_W^2 + \beta\|b\|^2$, when checking for a respective decrease, and compare it to the cost function value at a previous iteration. In some implementations, the processor can compare the decrease in the cost function, if any, to a given fraction of the cost function in a previous iteration (e.g., to a $C_{s-1}$, where a is a small number such as 0.001, 0.005, 0.01, 0.02 or other real number). If the test criterion is not met (decision block 240), the processor can update the phase based on the updated RF pulse and increment an iteration index (stage 250) before iterating back to stage 230. For example, the processor can update the phase outside the target (i.e., $\varphi_{\overline{\Omega}}$) by setting $\varphi_{\overline{\Omega}}$ to the angle of the term A(k)b denoted herein as $\angle_{\overline{\Omega}}(A(k)b)$, whereas the phase component $\varphi_n$ can be kept at, or set again to, the initial phase compensation value ($\varphi_n = \varphi_\Omega^0$). The phase criterion (or phase constraint) of setting $\varphi_n = \varphi_\Omega^2$ allows for designing the excitation phase $\varphi$ within the target object in a way to fully (or partially) nullify a given phase distribution. In some implementations, the phase distribution can be estimated using data acquired during an MRI scan. Performing the MRI scan can include transmitting one or more transmit RF pulses, such as a train of transmit RF pulses. The MRI scanner can then acquire data associated with a train of RF signals produced by the target object responsive to transmission of the train of transmit RF pulses.

If the test criterion is met (decision block 240), the processor can check whether the target number of spokes is reached (decision block 260). If the target number of spokes is not reached, the processor can add another spoke to the current spokes (stage 270). In some implementations, adding a new or another spoke includes calculating the residual excitation error $C_s$ using the current spokes. The processor can use the residual error to select a new spoke among a set of candidates. In some implementations, the processor can use a greedy algorithm to select the new spoke. In some implementations, the processor can use other algorithms. Once the new spoke is added, the processor can iterate back to stage 220 where the Fourier transform matrix A is updated. And the process described through stages 220-270 can be repeated with the added spoke. The whole optimization can stop when the maximum number of desired spokes has been reached. If the target number of spokes is reached (decision block 260) the process 200 can be stopped and the MRI scanner can use a current set of pulses to image the target object.

An implementation of the process 200 can be described as follows for example, with l indicating the current number of spokes, P indicating imaging parameters, and s indicating an iteration index.

1. Given M, $\varphi_\Omega^0$, and P, set $\varphi_\Omega = \varphi_\Omega^0$, $\varphi_{\overline{\Omega}} = 0$, $k_x = k_y = 0$, $l = 1$
2. Formulate Fourier transform matrix A; Set cost $C_0 = \infty$; Set $s = 1$;
3. Update b using Eq. (4);
4. Calculate new cost $C_s = \|Me^{-i\varphi_{\overline{\Omega}\cup\Omega}} - A(k)b\|^2 + \beta\|b\|^2$;
5. If $|C_s - C_{s-1}| \leq 0.01|C_{s-1}|$ or $s > N_s$ go to 7;
6. Set $s = s+1$, $\varphi_{\overline{\Omega}} = \angle_{\overline{\Omega}}(A(k)b)$ and $\varphi_\Omega = \varphi_\Omega^0$, go back to 3;
7. If $l < N_l$, use greedy method to add a new spoke and go back to 2; otherwise stop.

In some embodiments, a spoke is one line in the "excitation k-space", which corresponds to a segment of the gradient that is played out along with the excitation RF waveform. To navigate to a new spoke, gradient blips can be added between spokes to traverse the excitation k-space. Multiple spokes can represent the collection of multiple segments of gradients joined together with gradient blips. Theoretically, they can represent the traversing of excitation k-space with corresponding RF weighting in order to achieve the desired excitation pattern. in some implementations, the spokes can be generated (e.g., by the processor) in the optimization process one spoke at a time. The ordering of the spokes from the optimization can be determined by the behavior of the cost function. However, after the spokes are generated, the processor can shuffle their ordering to achieve specific goals, such as minimum echo time or shortest pulse duration. It should be noted that the excitation pattern is the same after reordering ignoring relaxation during excitation.

In some implementations, the processor can rearrange the order of the spokes such that the gradient trajectory traverses the transverse ($k_x$, $k_y$) plane more efficiently. For example, the spokes belonging to the same column with the minimum $k_y$ can be ordered sequentially based on their $k_x$ values first. Then, the next column with the next minimum $k_y$ can be put in the queue with a reversed $k_x$ order. Such reordering can guarantee the smallest gradient areas of the gradient blips in the transverse plane, in some embodiments. Other order of arrangements can also be used to achieve different goals. For example, the processor can rearrange the order such that the center spoke is traversed last to minimize echo time. Rewinding gradients can be added at the end of the pulse. For example, the gradient pulses can be optimized for shortest duration by utilizing the maximum slew rate and gradient amplitude.

A person skilled in the art should appreciate that the process 200 can be implemented in many different ways. For example, the cost function (3) can be formulated differently, for example, by using a different regularization other than Tikhonov regularization and/or by incorporating a spatial weighting matrix such as the matrix W in equation (2). Also the order of some steps of the process 200 can be arranged differently. For example, the order of the decision block 260 and the stage 270 can be reversed.

By way of illustration, a standard 3-echo 3D gradient recalled echo (GRE) sequence was used to acquire magnetic field inhomogeneity map referred to herein as $\Delta B$. The magnetic field inhomogeneity can be a source of phase variation. A standard sinc slab selective pulse can be used. The magnetic field inhomogeneity map $\Delta B$ was then used as input to the process 200 along with the echo time (TE) in a corresponding manner to form the target phase, according to one or more embodiments. For example, to cancel phase variations due to field inhomogeneity, the phase inside the target object can be set (or enforced) to be $$\varphi_\Omega^0 = -\gamma \Delta B \cdot TE. \quad (5)$$

The phase constraint (or phase criterion) described in equation (5) allows for nullifying, minimizing, reducing or cancelling the phase variations due to field inhomogeneity. In some implementations, the phase constraint (or phase criterion) can be designed (or defined) in a way to nullify, counteract, minimize, reduce or mitigate a phase distribution (e.g., due to field inhomogeneity) to at least a given level. That is, the phase constraint can be applied to cancel the phase distribution completely or partially. For example, the cancellation of the phase distribution can be 100% or less than 100% (e.g., 99%, 95%, 90%, 80%, etc.) in various embodiments of the present systems and methods. Once the RF pulse is designed, it can then be used to replace the original sinc RF pulse to compensate for or correct for otherwise existing phase behavior. For instance, if data associated with a first MRI scan is acquired at TE=5 milli-seconds, the phase inside the target object can be set to be equal to $\varphi_\Omega^0 = -0.005\gamma\Delta B$ at TE=5 milli-seconds of a second MRI scan using the determined (or designed) RF pulse. In some implementations, based on a compensation phase value recorded at a first echo time instance (e.g., $TE_1$=5 milli-seconds) associated with a first MRI scan, the processor can estimate another compensation phase value at another echo time instance (e.g., $TE_2$=10 milli-seconds). The processor can then set the phase inside the target object to be $\varphi_\Omega^0 = -\gamma\Delta B \cdot TE_2$ when determining a second RF transmit pulse for use in a second MRI scan. In the second scan, the processor can record the RF signal produced by the target object (in response to transmission of the designed RF transmit pulse) at echo time $TE_2$.

For a GRE scan, the phase pattern to be mitigated can be formulated as $\varphi = \beta \cdot TE$, where $\beta$ is a constant. In order to nullify or at least mitigate such phase pattern, the second transmit RF signal can be configured (or determined in a way) to generate a phase equal to the negative of the phase pattern $\varphi$. Accordingly, the resulting phase in response to the second transmit RF signal can become zero or at least close to zero. For instance, by setting the phase inside the target object at a given TE according to equation (5) when determining the second transmit RF pulse, the determined second transmit Rf pulse can then result in cancelling or at least mitigating the phase pattern at a given TE. That is, the phase change due to $\Delta B$ will be cancelled or at least significantly mitigated at time TE when using the second transmit RF pulse for imaging the object.

One-dimensional (1-D), 2-dimensional (2-D) and/or 3-dimensional (3-D) pulses can be designed according to the process 200 shown in FIG. 2 and validated through numerical simulations. The 1-D and 2-D pulses can be incorporated into a GRE sequence and tested on a normal volunteer for in vivo validation.

Figure 3:
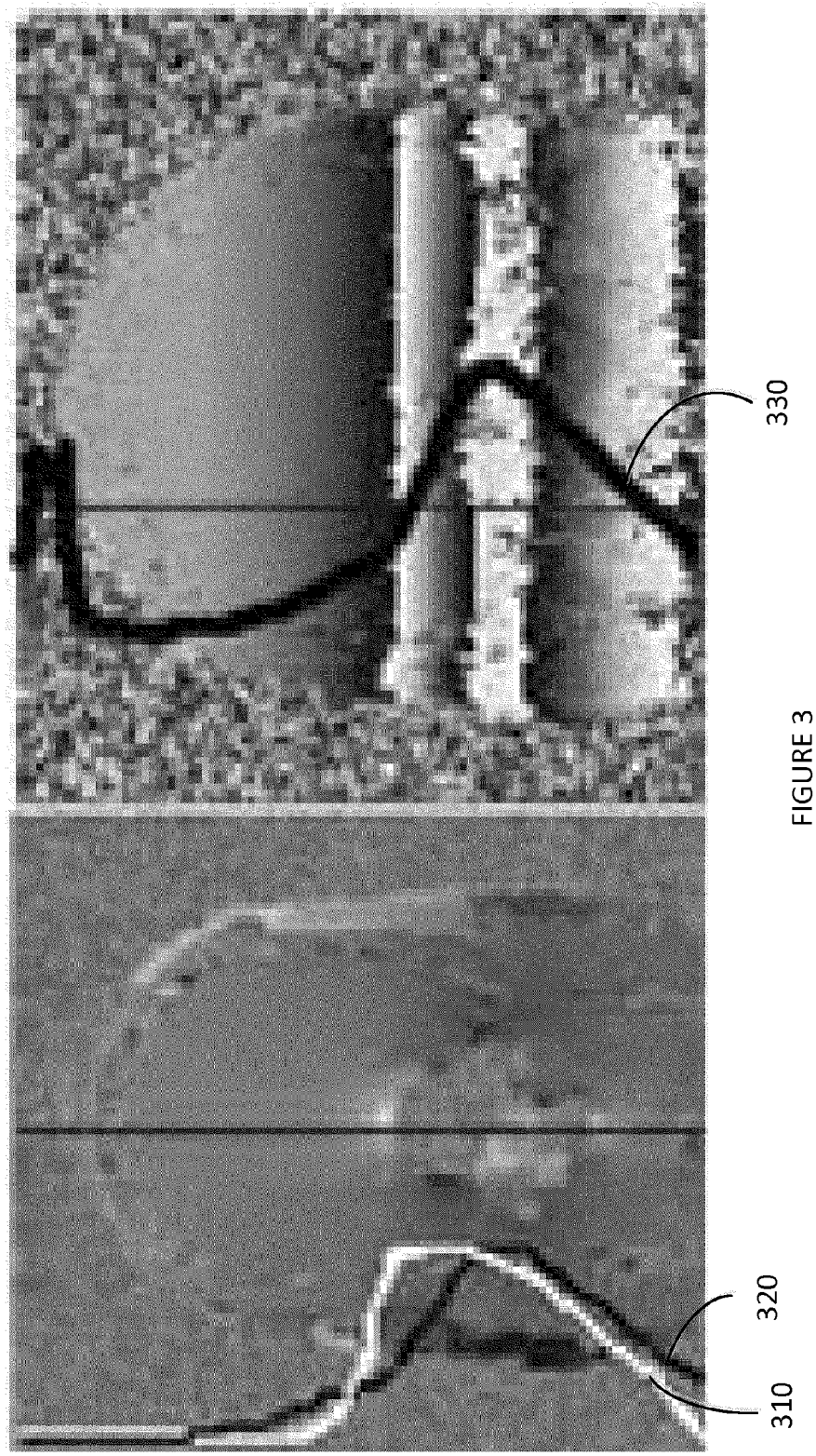
FIG. 3 shows an illustrative embodiment of simulation results for a designed 1-D RF pulse.

FIG. 3 shows example simulation results for a designed 1-D pulse. The phase profile along a selected line across the slice-select direction can be taken and low-pass filtered to form the calibration profile, from which a magnetic field inhomogeneity map along this line can be calculated. The magnetic field inhomogeneity map can then be used to design the 1-D pulse. The pulse may be used to acquire a 3-D volume on a normal volunteer. In the left side of FIG. 3, an unwrapped phase obtained from a calibration scan with a line profile is shown by the white curve 310 and the respective low-pass filtered version is shown using the black curve 320. On the right side of FIG. 3, the black curve 330 shows the unwrapped line profile of the RF pulse induced phase. It is seen that the RF induced phase closely matches the calibration profile.

Figure 4:
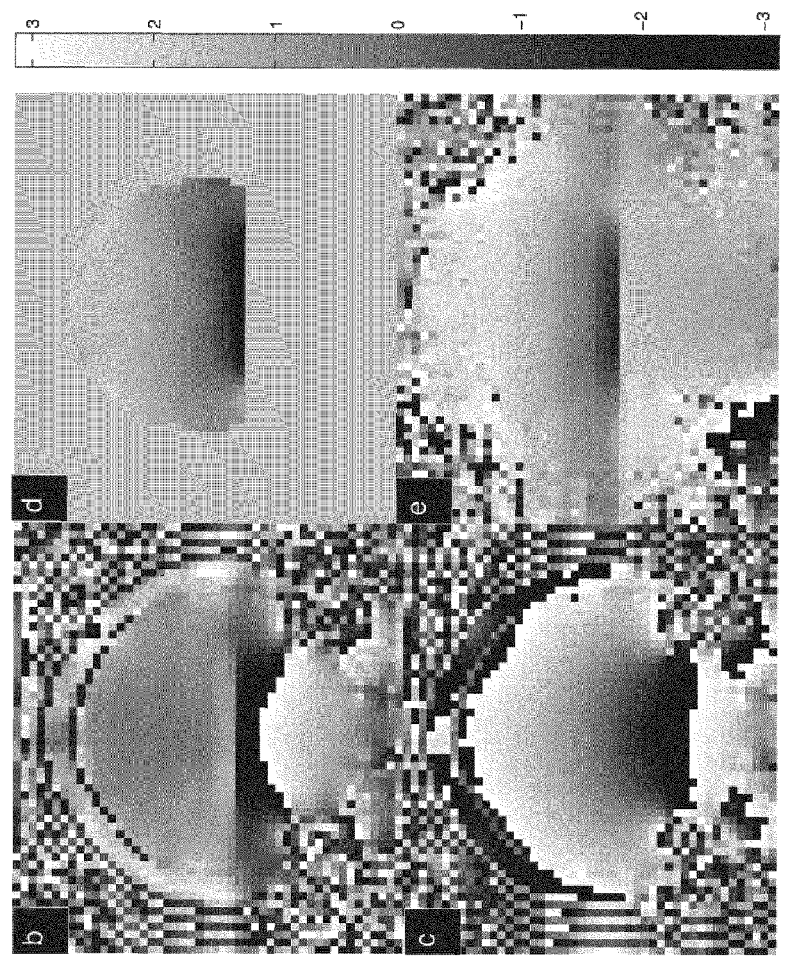
FIG. 4 shows an illustrative embodiment of simulation results for a designed 2-D RF pulse.
Figure 4:
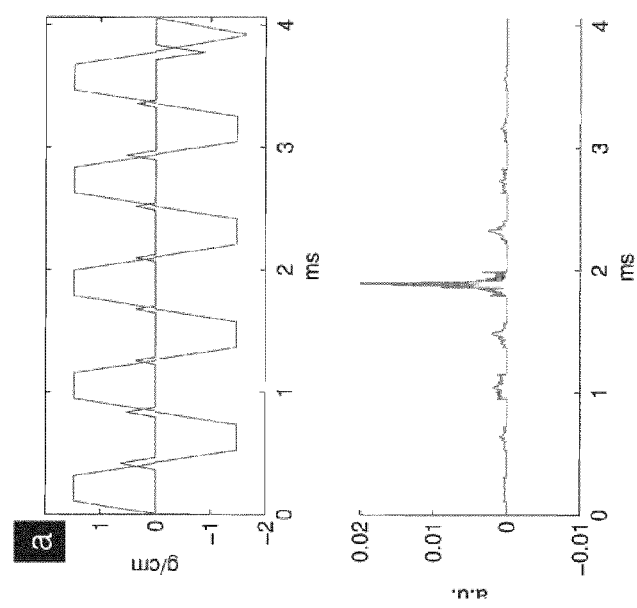

FIG. 4 shows simulation results for an example design of 2-D pulses. The calibration profile is shown in the image (d) and the designed 2-D pulse is indicated by the plots in (a) with 9 spokes and a pulse duration of about 4 milliseconds (ms), by way of illustration. The image (b) shows the phase image at echo time corresponding to the designed 2D pulse, while the image (c) shows the phase image at echo time corresponding to a sinc pulse. The difference between the two phase images is shown in image (e) in one example embodiment. The results indicate that the induced phase of the designed 2-D RF pulse followed the phase corresponding to the sinc pulse within the target object. As such, the phase of the designed 2-D RF pulse can compensate the magnetic field inhomogeneity induced phase.

Figure 5:
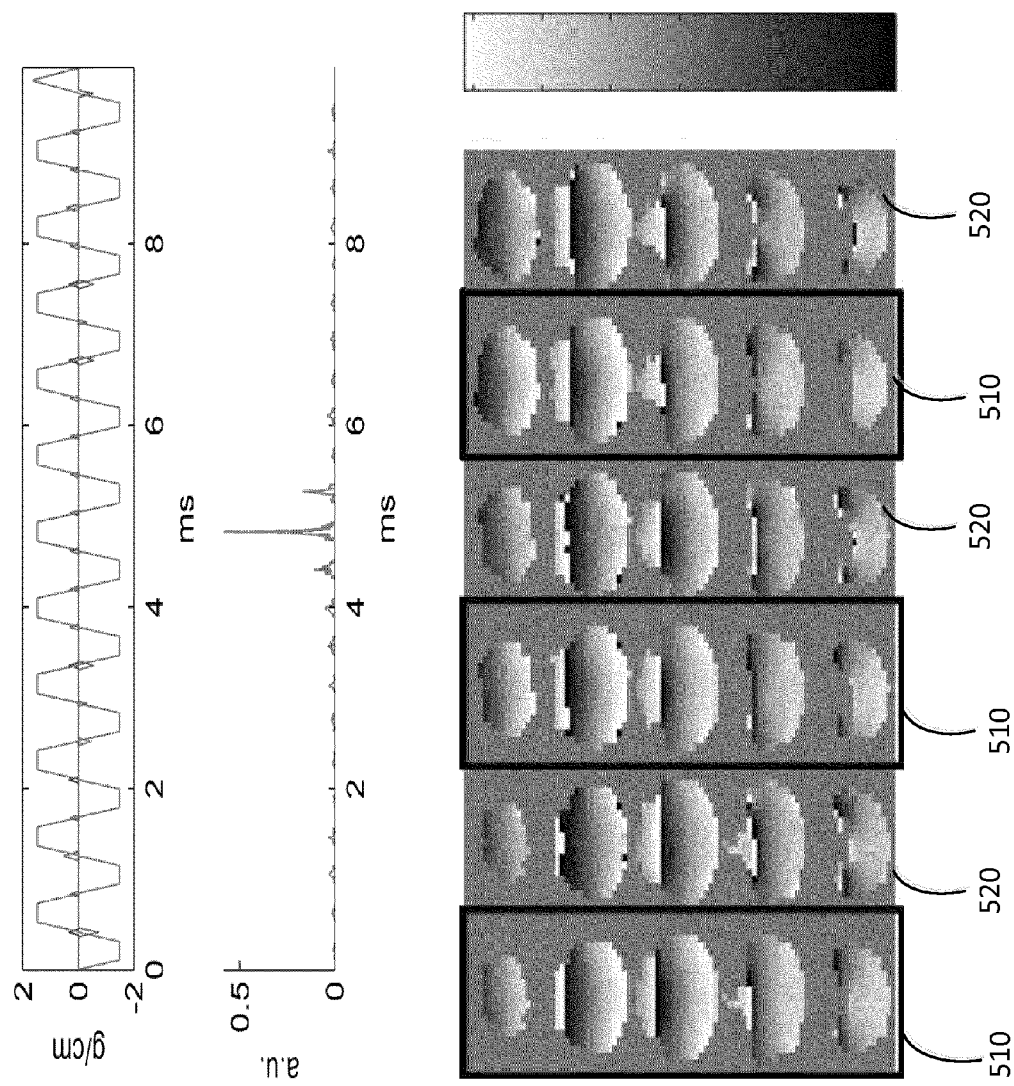
FIG. 5 shows an illustrative embodiment of simulation results for a designed 3-D RF pulse.

FIG. 5 shows example simulation results for a 3-D RF pulse designed according to process 200 and was validated numerically. The 3-D pulse is designed with 23 spokes with a duration of about 10 ms and is indicated by the top plots of FIG. 5, in some embodiments. The phase images 510 within the black rectangles indicate the induced phase obtained through Bloch equation simulation whereas the other phase images 520 represent the corresponding calibration phase at the echo time. The simulation results indicate the capability of the designed pulses to compensate for magnetic field inhomogeneity induced phase.

A person skilled in the art should appreciate that processes described in this disclosure can be implemented using computer code instructions executable by a processor. The computer code instructions can be stored on a non-transitory or tangible computer-readable medium such as a random access memory (RAM), a read only memory (ROM), a cache memory, a disc memory, any other memory, or any other computer readable medium. Processes described in this disclosure can be implemented by an apparatus including at least one processor and/or memory storing executable code instructions. The code instructions when executed by the at least one processor can cause performing at least one of the processes or operations described in this disclosure. The apparatus can for example be a MRI scanner, a computer device or other electronic device associated with a MRI scanner.

What is claimed is:

1. An apparatus for magnetic resonance imaging (MRI), comprising:
    a magnet for applying a magnetic field to a target object;
    one or more radio frequency (RF) transceivers for transmitting and receiving RF signals; and
    a processor configured to:
        cause a first MM scan to be performed on the target object using a first transmit radio frequency (RF) pulse;
        acquire data associated with a first RF signal produced by the target object responsive to the first MM scan;
        determine a second transmit RF pulse by iteratively minimizing an optimization formulation defined using the acquired data and a phase criterion, the phase criterion to nullify or mitigate a phase associated with the acquired data within the target object when performing a second MM scan using the second transmit RF pulse; and
        cause a second MRI scan to be performed on the target object using the second transmit RF pulse.

2. The apparatus of claim 1, wherein a three-dimensional (3-D) multi-echo gradient echo sequence is used in the first MM scan.

3. The apparatus of claim 1, wherein a two-dimensional (2-D) gradient echo sequence is used in the first MRI scan.

4. The apparatus of claim 1, wherein a steady state free precession (SSFP) sequence is used in the first MRI scan.

5. The apparatus of claim 1, wherein determining a second transmit RF pulse comprises determining the second transmit RF pulse by minimizing a phase dependent objective function subject to a phase constraint in the target object.

6. The apparatus of claim 1, wherein determining a second transmit RF pulse comprises employing a calibration phase associated with the target object.

7. The apparatus of claim 6 wherein the calibration phase is obtained based on the acquired data associated with the first RF signal produced by the target object responsive to performing the first MM scan.

8. The apparatus of claim 6 wherein determining a second transmit RF pulse comprises determining a transmit RF pulse configured to mitigate the calibration phase.

9. A method for magnetic resonance imaging(MRI), comprising:
    performing a first MM scan on a target object using a first transmit radio frequency (RF) pulse;
    acquiring data associated with a first RF signal produced by the target object responsive to the first MM scan;
    determining a second transmit RF pulse by iteratively minimizing an optimization formulation defined using the acquired data and a phase criterion, the phase criterion to nullify or mitigate a phase associated with the acquired data within the target object when performing a second MM scan using the second transmit RF pulse; and
    performing a second MM scan to the target object using the second transmit RF pulse.

10. The method of claim 9, wherein a three-dimensional (3-D) multi-echo gradient echo sequence is used in the first MRI scan.

11. The method of claim 9, wherein a two-dimensional (2-D) gradient echo sequence is used in the first MRI scan.

12. The method of claim 9, wherein a steady state free precession (SSFP) sequence is used in the first MRI scan.

13. The method of claim 9, wherein determining a second RF transmit pulse comprises determining the second RF transmit pulse by iteratively minimizing a phase dependent objective function subject to a phase constraint within the target object.

14. The method of claim 9, wherein determining a second transmit RF pulse comprises employing a calibration phase associated with the target object.

15. The method of claim 14 further comprising obtaining the calibration phase from the acquired data.

16. The method of claim 14 wherein determining a second transmit RF pulse comprises determining a transmit RF pulse configured to mitigate the calibration phase.

* * * * *